(12) United States Patent
Van Dommelen et al.

(10) Patent No.: US 10,394,137 B2
(45) Date of Patent: *Aug. 27, 2019

(54) INSPECTION METHOD, LITHOGRAPHIC APPARATUS, MASK AND SUBSTRATE

(71) Applicant: ASML Netherlands B.V., Veldhoven (NL)

(72) Inventors: Youri Johannes Laurentius Maria Van Dommelen, Ballston Lake, NY (US); Peter David Engblom, Hillsboro, OR (US); Lambertus Gerardus Maria Kessels, Ballston Lake, NY (US); Arie Jeffrey Den Boef, Waalre (NL); Kaustuve Bhattacharyya, Veldhoven (NL); Paul Christiaan Hinnen, Veldhoven (NL); Marco Johannes Annemarie Pieters, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

This patent is subject to a terminal disclaimer.

(21) Appl. No.: 15/968,743

(22) Filed: May 1, 2018

(65) Prior Publication Data
US 2018/0253018 A1 Sep. 6, 2018

Related U.S. Application Data

(63) Continuation of application No. 15/104,212, filed as application No. PCT/EP2014/075168 on Nov. 20, 2014, now Pat. No. 10,001,711.
(Continued)

(51) Int. Cl.
*G03F 7/20* (2006.01)

(52) U.S. Cl.
CPC ...... *G03F 7/70641* (2013.01); *G03F 7/70683* (2013.01)

(58) Field of Classification Search
CPC .................. G03F 7/70641; G03F 7/70683
See application file for complete search history.

(56) References Cited

U.S. PATENT DOCUMENTS

| 7,532,307 B2 | 5/2009 | Van Der Schaar et al. |
| 8,208,122 B2 | 6/2012 | Staals et al. |
| (Continued) | | |

FOREIGN PATENT DOCUMENTS

| CN | 1892440 | 1/2007 |
| EP | 1 628 164 | 2/2006 |
| (Continued) | | |

OTHER PUBLICATIONS

International Search Report and Written Opinion dated Mar. 10, 2015 in corresponding International Patent Application No. PCT/EP2014/075168.
(Continued)

*Primary Examiner* — Steven Whitesell Gordon
(74) *Attorney, Agent, or Firm* — Pillsbury Winthrop Shaw Pittman LLP

(57) ABSTRACT

A method and apparatus for obtaining focus information relating to a lithographic process. The method includes illuminating a target, the target having alternating first and second structures, wherein the form of the second structures is focus dependent, while the form of the first structures does not have the same focus dependence as that of the second structures, and detecting radiation redirected by the target to obtain for that target an asymmetry measurement representing an overall asymmetry of the target, wherein the asymmetry measurement is indicative of focus of the beam
(Continued)

forming the target. An associated mask for forming such a target, and a substrate having such a target.

24 Claims, 10 Drawing Sheets

Related U.S. Application Data

(60) Provisional application No. 61/945,656, filed on Feb. 27, 2014, provisional application No. 61/917,041, filed on Dec. 17, 2013.

(56) References Cited

U.S. PATENT DOCUMENTS

| | | | |
|---|---|---|---|
| 8,477,289 B2 | 7/2013 | Slotboom et al. | |
| 8,687,167 B2 | 4/2014 | Padiy et al. | |
| 8,982,329 B2 | 3/2015 | Van Der Schaar et al. | |
| 9,182,682 B2 | 11/2015 | Cramer et al. | |
| 2002/0182516 A1 | 12/2002 | Bowes | |
| 2006/0103836 A1* | 5/2006 | Levinski | G03F 7/70641 356/123 |
| 2008/0160425 A1* | 7/2008 | Hong | G03F 1/44 430/5 |
| 2008/0180647 A1 | 7/2008 | Sugino | |
| 2009/0135389 A1* | 5/2009 | Hofmans | G03F 7/70641 355/55 |
| 2009/0135398 A1 | 5/2009 | Kawakami | |
| 2009/0263733 A1 | 10/2009 | Nomura | |
| 2009/0268182 A1 | 10/2009 | Staals et al. | |
| 2009/0296058 A1* | 12/2009 | Slotboom | G03F 7/70516 355/53 |
| 2011/0109888 A1 | 5/2011 | Van Der Schaar et al. | |
| 2013/0050668 A1* | 2/2013 | Kisteman | G03F 7/70641 355/55 |
| 2014/0071415 A1* | 3/2014 | Brunner | G03F 1/50 355/55 |
| 2015/0338749 A1* | 11/2015 | Hinnen | G03F 1/44 355/55 |

FOREIGN PATENT DOCUMENTS

| | | |
|---|---|---|
| EP | 1 739 491 | 1/2007 |
| JP | 2006-039148 | 2/2006 |
| JP | 2007-013169 | 1/2007 |
| JP | 2009-260344 | 11/2009 |
| JP | 2009302532 | 12/2009 |
| JP | 2013-520020 | 5/2013 |
| TW | 201428418 | 7/2014 |
| WO | 2009/130010 | 10/2009 |
| WO | 2010/076232 | 7/2010 |
| WO | 2013/189724 | 12/2013 |
| WO | 2014/074868 | 5/2014 |

OTHER PUBLICATIONS

Disclosed Anonymously, "Focus measurement in the extreme ultraviolet (EUV) lithography," Research Disclosure RD578001, pp. 1-4 (Jun. 2012).
Prasad Dasari et al., "Scatterometry evaluation of focus-dose effects of EUV structures," Proc. of SPIE, vol. 8681, pp. 86810T-1-86810T-15 (Apr. 10, 2013).
Japanese Office Action dated May 23, 2017 in corresponding Japanese Patent Application No. 2016-538541 (21 pages).
Chinese Office Action dated May 12, 2017 in corresponding Chinese Patent Application No. 201480075272.6 (10 pages).
Korean Office Action dated Oct. 25, 2017 in corresponding Korean Patent Application No. 10-2016-7018429.
Disclosed Anonymously, "Combined overlay and focus-dose target," Research Disclosure No. 545016, pp. 1-2 (Aug. 19, 2009).
Disclosed Anonymously, "Focus Metrology for EUV Lithographic Systems," Research Disclosure No. 581025, pp. 1-4 (Aug. 13, 2012).
Office Action issued in corresponding ROC (Taiwan) Patent Application No. 105140546, dated Mar. 21, 2018.
Japanese Office Action issued in corresponding Japanese Patent Application No. 2018-085681, dated Mar. 13, 2019.

* cited by examiner

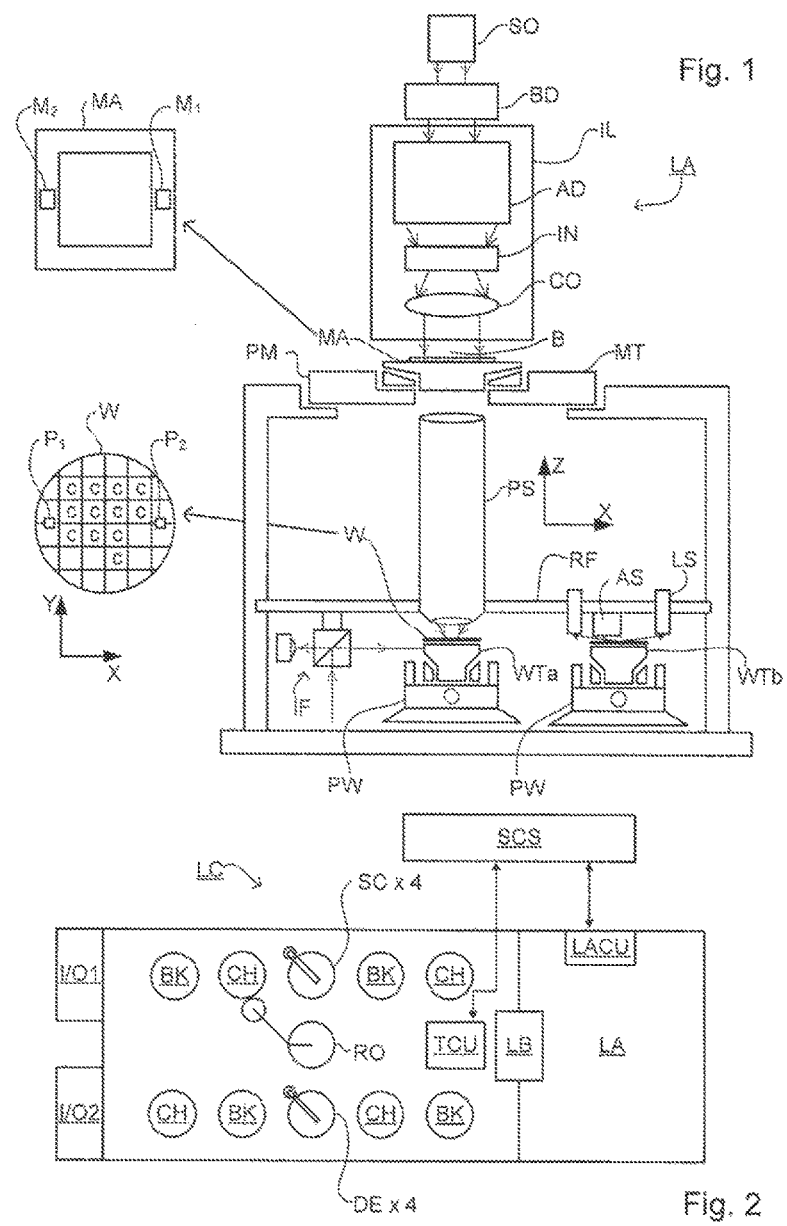

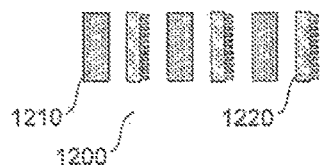
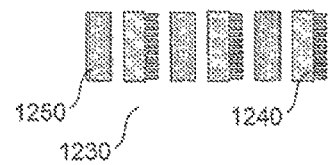
Fig. 12a    Fig. 12b
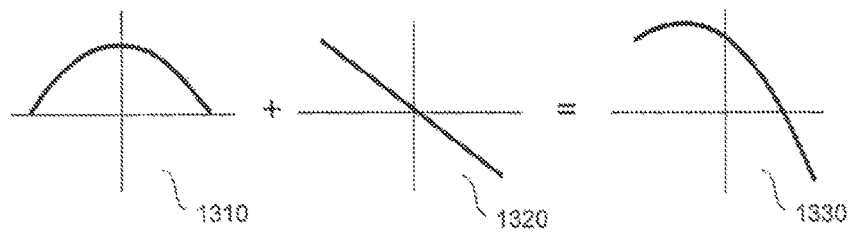
Fig. 13a
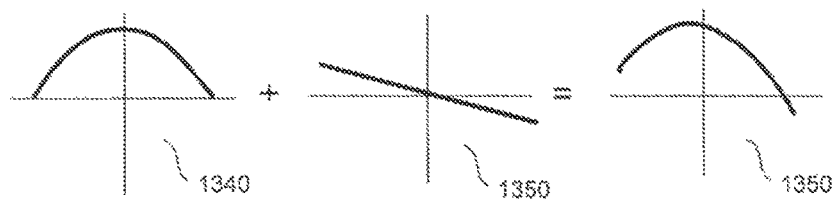
Fig. 13b
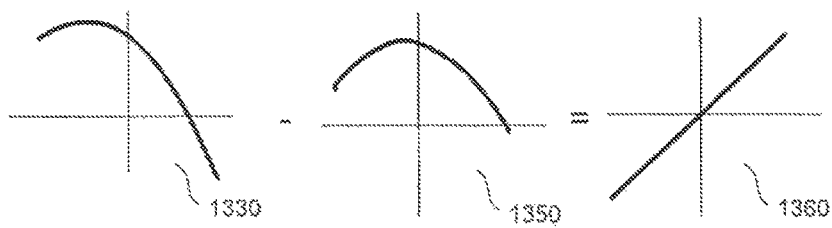
Fig. 13c

INSPECTION METHOD, LITHOGRAPHIC APPARATUS, MASK AND SUBSTRATE

This application is a continuation of U.S. patent application Ser. No. 15/104,212, filed Jun. 13, 2016, which is the U.S. national phase entry of PCT Patent Application No. PCT/EP2014/075168, which was filed on Nov. 20, 2014, which claims the benefit of priority of U.S. Provisional Patent Application No. 61/917,041, filed Dec. 17, 2013, and U.S. Provisional Patent Application No. 61/945,656, filed Feb. 27, 2014, each which is incorporated by reference herein in its entirety.

FIELD

The present description relates to methods of inspection usable, for example, in the manufacture of devices by a lithographic technique.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In order to monitor the lithographic process, one or more parameters of the patterned substrate are measured. Such parameters may include, for example, the overlay error between successive layers formed in or on the patterned substrate and/or critical linewidth of developed photosensitive resist. Such measurement may be performed on a product substrate and/or on a dedicated metrology target. There are various techniques for making measurements of the microscopic structures formed in lithographic processes, including the use of a scanning electron microscope and various other specialized tools. A fast and non-invasive form of specialized inspection tool is a scatterometer in which a beam of radiation is directed onto a target on the surface of the substrate and one or more properties of the scattered or reflected beam are measured. By comparing the one or more properties of the beam before and after it has been reflected or scattered by the substrate, a property of the substrate can be determined. This can be done, for example, by comparing the reflected beam with data stored in a library of known measurements associated with one or more known substrate properties. Two main types of scatterometer are known. A spectroscopic scatterometer directs a broadband radiation beam onto the substrate and measures the spectrum (intensity as a function of wavelength) of the radiation scattered into a particular narrow angular range. An angularly resolved scatterometer uses a monochromatic radiation beam and measures the intensity of the scattered radiation as a function of angle.

SUMMARY

Focus measurements in EUV lithography may be based on the variation of focus calibration marks on a substrate through different focus settings. United States Patent Application Publication No. US 2009-0135398 discloses a phase grating alignment sensor which may be used to read out the marks. The size of the focus calibration marks read using the methods disclosed in that document is 600×600 $\mu m^2$. Methods to measure focus in EUV lithography are based on the detection of mark quality change through focus and are very sensitive to dose and process variations.

In order to use a scatterometer for focus readout, the targets should be smaller (for example 40×40 $\mu m^2$) to fulfil customer requirements such as target area, while the number of line spaces within the beam width of the metrology tool should be more than 10 periods. Methods of focus measurement using a scatterometer may be based on the measurement of critical dimension (CD) and side-wall-angle (SWA) of targets (e.g., periodic structures (gratings) on the substrate).

However, for various reasons, this method of diffraction-based metrology does not work so well for EUV device manufacturing processes. In particular, EUV resist film thicknesses are significantly lower (~50 nm and below) compared to those of 193 nm immersion lithography (~100 nm) which makes it difficult to extract accurate SWA and/or CD information from EUV substrate.

It is desirable, for example, to provide a method enabling the use of diffraction-based metrology on structures exposed using EUV systems.

According to an aspect, there is provided a method of obtaining focus information relating to a lithographic process, the method comprising: providing at least one target, the target comprising alternating first and second structures, the form of the second structures being focus dependent such that its form depends upon the focus of a patterned beam used to form the target and the form of the first structures not having the same focus dependence as that of the second structures; illuminating the target; and detecting radiation scattered by the target to obtain for that target an asymmetry measurement representing an overall asymmetry of the target, wherein the asymmetry measurement is indicative of the focus of the patterned beam when forming the target.

According to an aspect, there is provided a mask comprising a pattern for patterning a beam to form a target comprising alternating first and second structures, the mask comprising first structure features for forming the first structures and second structure features for forming the second structures, wherein the second structure features are configured such that the form of the second structures is focus dependent such that its form depends upon the focus of the patterned beam when forming the target and the first structure features are configured such that the form of the first structures does not have the same focus dependence as that of the second structures.

According to an aspect, there is provided a substrate comprising a target having alternating first and second structures wherein: the first structure and the second structure both comprise a low resolution substructure; and at least the second structure comprises one or more high resolution substructures, the number and/or size of high resolution substructures in the target having been determined by the focus of a patterned beam used to form the target.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIG. 1 schematically depicts a lithographic apparatus;

FIG. 2 schematically depicts a lithographic cell or cluster;

FIGS. 12a and 12b show a two target arrangement for extraction of focus sign information according to an embodiment of the invention;

FIGS. 13a and 13b show graphs of asymmetry signal amplitude (y axis) against focus (x axis) for the two targets illustrated in FIGS. 12a and 12b including component signals thereof, and FIG. 13c shows the determination of the difference of the graphs of FIGS. 13a and 13b.

DETAILED DESCRIPTION

Figure 3:
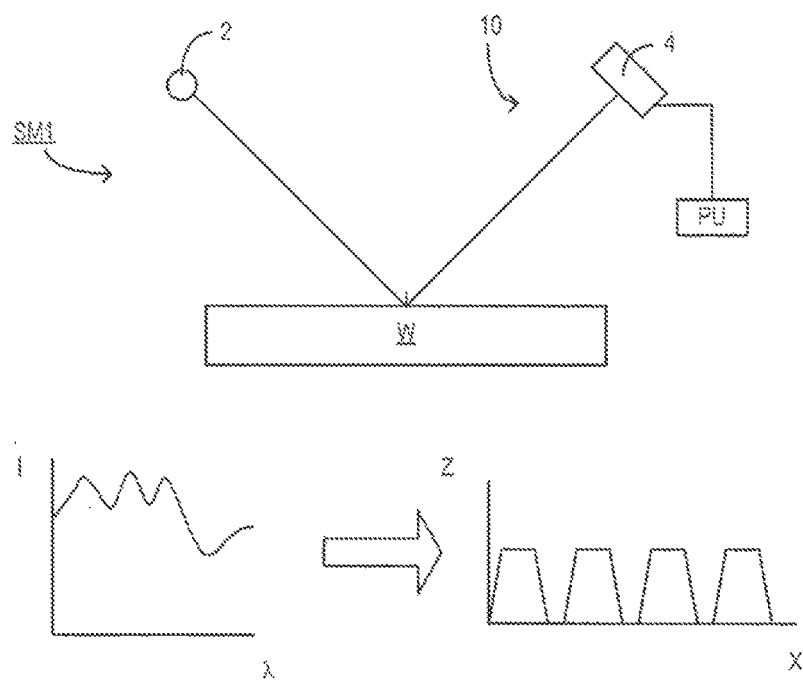
FIG. 3 schematically depicts a first scatterometer.

FIG. 1 schematically depicts a lithographic apparatus. The apparatus comprises:

an illumination system (illuminator) IL configured to condition a radiation beam B (e.g. UV radiation or DUV radiation);

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam, which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more tables (e.g., two or more substrate table and/or two or more patterning device tables and/or a substrate table and table not holding a substrate). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. Having traversed the patterning device MA, the radiation beam B passes through the projection system PS, which focuses the beam onto a target portion C of the substrate W. With the aid of the second positioner PW and position sensor IF (e.g. an interferometric device, linear encoder, 2-D encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the (de-) magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

As shown in FIG. 2, the lithographic apparatus LA forms part of a lithographic cell LC, also sometimes referred to a lithocell or cluster, which also includes apparatus to perform pre- and post-exposure processes on a substrate. Conventionally these include one or more spin coaters SC to deposit a resist layer, one or more developers DE to develop exposed resist, one or more chill plates CH and/or one or more bake plates BK. A substrate handler, or robot, RO picks up a substrate from input/output ports I/O1, I/O2, moves it between the different process apparatus and delivers it to the loading bay LB of the lithographic apparatus. These devices, which are often collectively referred to as the track, are under the control of a track control unit TCU which is itself controlled by the supervisory control system SCS, which also controls the lithographic apparatus via lithography control unit LACU. Thus, the different apparatus can be operated to maximize throughput and processing efficiency.

In order that the substrates that are exposed by the lithographic apparatus are exposed correctly and consistently, it is desirable to inspect exposed substrates to measure a property such as overlay error between subsequent layers, line thickness, critical dimension (CD), etc. If an error is detected, an adjustment may be made to an exposure of a subsequent substrate, especially if the inspection can be done soon and fast enough that one or more other substrates of the same batch are still to be exposed. Also, an already exposed substrate may be stripped and reworked—to improve yield—or discarded, thereby avoiding performing exposure on substrate known to be faulty. In a case where only some target portions of a substrate are faulty, further exposures can be performed only on those target portions which are good.

An inspection apparatus is used to determine a property of the substrate, and in particular, how one or more properties of different substrates or different layers of the same substrate vary from layer to layer. The inspection apparatus may be integrated into the lithographic apparatus LA or the lithocell LC or may be a stand-alone device. To enable most rapid measurements, it is desirable that the inspection apparatus measure properties in the exposed resist layer immediately after the exposure. However, the latent image in the resist has a very low contrast—there is only a very small difference in refractive index between the parts of the resist which have been exposed to radiation and those which have not—and not all inspection apparatus have sufficient sensitivity to make useful measurements of the latent image. Therefore measurements may be taken after the post-exposure bake step (PEB) which is customarily the first step carried out on an exposed substrate and increases the contrast between exposed and unexposed parts of the resist. At this stage, the image in the resist may be referred to as semi-latent. It is also possible to make measurements of the developed resist image—at which point either the exposed or unexposed parts of the resist have been removed—or after a pattern transfer step such as etching. The latter possibility limits the possibilities for rework of a faulty substrate but may still provide useful information.

FIG. 3 depicts a scatterometer which may be used in an embodiment of the present invention. It comprises a broadband (white light) radiation projector 2 which projects radiation onto a substrate W. The reflected radiation is passed to a spectrometer detector 4, which measures a spectrum 10 (intensity as a function of wavelength) of the specular reflected radiation. From this data, the structure or profile giving rise to the detected spectrum may be reconstructed by processing unit PU, e.g. by Rigorous Coupled Wave Analysis and non-linear regression or by comparison with a library of simulated spectra as shown at the bottom of FIG. 3. In general, for the reconstruction, the general form of the structure is known and some parameters are assumed from knowledge of the process by which the structure was made, leaving only a few parameters of the structure to be determined from the scatterometry data. Such a scatterometer may be configured as a normal-incidence scatterometer or an oblique-incidence scatterometer.

Figure 4:
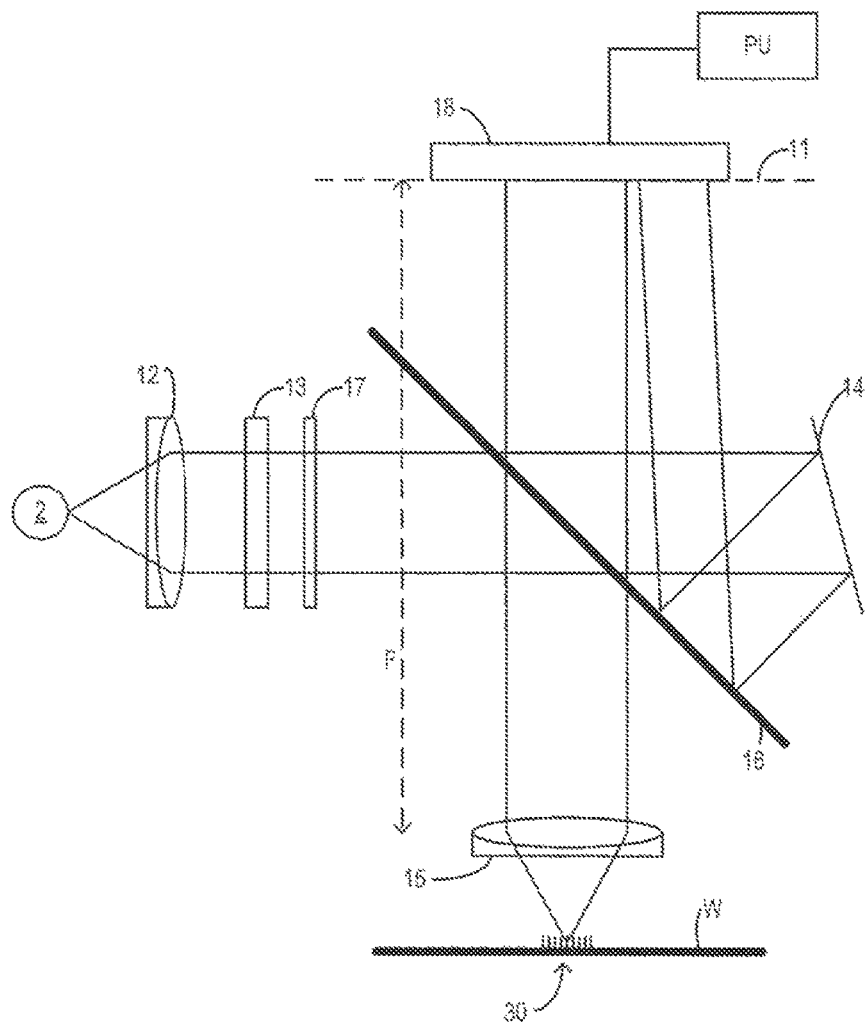
FIG. 4 schematically depicts a second scatterometer.

Another scatterometer that may be used is shown in FIG. 4. In this device, the radiation emitted by radiation source 2 is collimated using lens system 12 and transmitted through interference filter 13 and polarizer 17, reflected by partially reflected surface 16 and is focused onto substrate W via a microscope objective lens 15, which has a high numerical aperture (NA), desirably at least 0.9 or at least 0.95. An immersion scatterometer may even have a lens with a numerical aperture over 1. The reflected radiation then transmits through partially reflecting surface 16 into a detector 18 in order to have the scatter spectrum detected. The detector may be located in the back-projected pupil plane 11, which is at the focal length of the lens system 15, however the pupil plane may instead be re-imaged with auxiliary optics (not shown) onto the detector. The pupil plane is the plane in which the radial position of radiation defines the angle of incidence and the angular position defines the azimuth angle of the radiation. The detector is desirably a two-dimensional detector so that a two-dimensional angular scatter spectrum of a substrate target 30 can be measured. The detector 18 may be, for example, an array of CCD or CMOS sensors, and may use an integration time of, for example, 40 milliseconds per frame.

A reference beam is often used for example to measure the intensity of the incident radiation. To do this, when the radiation beam is incident on the beam splitter 16 part of it is transmitted through the beam splitter as a reference beam towards a reference mirror 14. The reference beam is then projected onto a different part of the same detector 18 or alternatively on to a different detector (not shown).

A set of interference filters 13 is available to select a wavelength of interest in the range of, say, 405-790 nm or even lower, such as 200-300 nm. The interference filter may be tunable rather than comprising a set of different filters. A grating could be used instead of interference filters.

The detector 18 may measure the intensity of scattered radiation at a single wavelength (or narrow wavelength range), the intensity separately at multiple wavelengths or integrated over a wavelength range. Furthermore, the detector may separately measure the intensity of transverse magnetic- and transverse electric-polarized radiation and/or the phase difference between the transverse magnetic- and transverse electric-polarized radiation.

Using a broadband radiation source (i.e. one with a wide range of radiation frequencies or wavelengths—and therefore of colors) is possible, which gives a large etendue, allowing the mixing of multiple wavelengths. The plurality of wavelengths in the broadband desirably each has a bandwidth of $\Delta\lambda$ and a spacing of at least 2 $\Delta\lambda$ (i.e. twice the bandwidth). Several "sources" of radiation can be different portions of an extended radiation source which have been split using fiber bundles. In this way, angle resolved scatter spectra can be measured at multiple wavelengths in parallel. A 3-D spectrum (wavelength and two different angles) can be measured, which contains more information than a 2-D spectrum. This allows more information to be measured which increases metrology process robustness. This is described in more detail in European Patent Application Publication No. EP1628164, which is incorporated herein by reference.

The target 30 on substrate W may be a 1-D grating, which is printed such that after development, the bars are formed of solid resist lines. The target 30 may be a 2-D grating, which is printed such that after development, the grating is formed of solid resist pillars or vias in the resist. The bars, pillars or vias may alternatively be etched into the substrate. This pattern is sensitive to chromatic aberration in the lithographic projection apparatus, particularly the projection system PS, and illumination symmetry and the presence of such aberration will manifest itself in a variation in the printed grating. Accordingly, the scatterometry data of the printed gratings is used to reconstruct the gratings. The parameters of the 1-D grating, such as line widths and shapes, or parameters of the 2-D grating, such as pillar or via widths or lengths or shapes, may be input to the reconstruction process, performed by processing unit PU, from knowledge of the printing step and/or other scatterometry processes.

As described above, the target is on the surface of the substrate. This target will often take the shape of a series of lines in a grating or substantially rectangular structures in a 2-D array. The purpose of rigorous optical diffraction theories in metrology is effectively the calculation of a diffraction spectrum that is reflected from the target. In other words, target shape information is obtained for CD (critical dimension) uniformity and overlay metrology. Overlay metrology is a measuring in which the overlay of two targets is measured in order to determine whether two layers on a substrate are aligned or not. CD uniformity is simply a measurement of the uniformity of the grating on the spectrum to determine how the exposure system of the lithographic apparatus is functioning. Specifically, CD, or critical dimension, is the width of the object that is "written" on the substrate and is the limit at which a lithographic apparatus is physically able to write on a substrate.

Using one of the scatterometers described above in combination with a model of a target structure such as the target 30 and its diffraction properties, measurement of the shape and other parameters of the structure can be performed in a number of ways. In a first type of process, represented by FIG. 5, a diffraction pattern based on a first estimate of the target shape (a first candidate structure) is calculated and compared with the observed diffraction pattern. Parameters of the model are then varied systematically and the diffraction re-calculated in a series of iterations, to generate new candidate structures and so arrive at a best fit. In a second type of process, represented by FIG. 6, diffraction spectra for many different candidate structures are calculated in advance to create a 'library', of diffraction spectra. Then the diffraction pattern observed from the measurement target is compared with the library of calculated spectra to find a best fit. Both methods can be used together: a coarse fit can be obtained from a library, followed by an iterative process to find a best fit.

Figure 5:
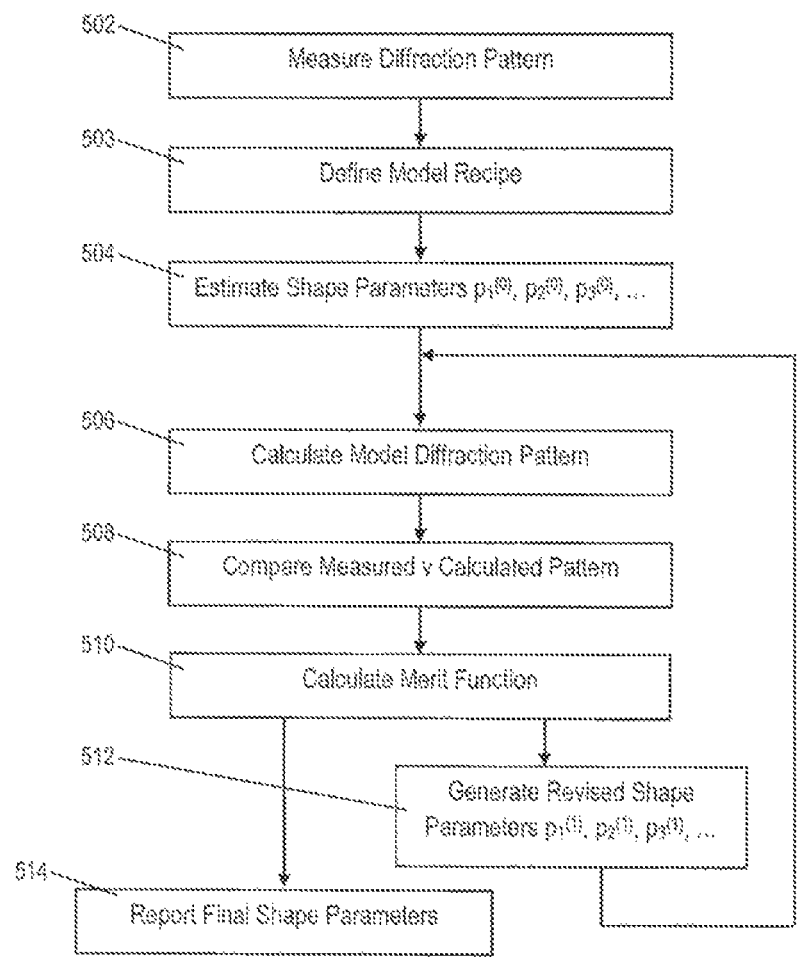
FIG. 5 depicts an example process for reconstruction of a structure from scatterometer measurements.

Referring to FIG. 5 in more detail, the way the measurement of the target shape and/or a material property is carried out will be described in summary. The target will be assumed for this description to be periodic in only 1 direction (1-D structure). In practice it may be periodic in 2 or 3 directions (2- or 3-dimensional structure), and the processing will be adapted accordingly.

At 502, the diffraction pattern of the actual target on the substrate is measured using a scatterometer such as those described above. This measured diffraction pattern is forwarded to a calculation system such as a computer. The calculation system may be the processing unit PU referred to above, or it may be a separate apparatus.

At 503, a 'model recipe' is established which defines a parameterized model of the target structure in terms of a number of parameters $p_i$ ($p_1$, $p_2$, $p_3$ and so on). These parameters may represent for example, in a 1D periodic structure, the angle of a side wall, the height or depth of a feature, and/or the width of the feature. One or more properties of the target material and one or more underlying layers are also represented by a parameter such as refractive index (at a particular wavelength present in the scatterometry radiation beam). Specific examples will be given below. Significantly, while a target structure may be defined by dozens of parameters describing its shape and material property, the model recipe will define many of these to have fixed values, while others are to be variable or 'floating' parameters for the purpose of the following process steps. The process by which the choice between fixed and floating parameters is made is described hereafter. Moreover, ways will be introduced in which parameters can be permitted to vary without being fully independent floating parameters. For the purposes of describing FIG. 5, only the variable parameters are considered as parameters pi.

At 504, a model target shape is estimated by setting initial values $p_i^{(0)}$ for the floating parameters (i.e. $p_1^{(0)}$, $p_2^{(0)}$, $p_3^{(0)}$ and so on). Each floating parameter will be generated within a certain predetermined range, as defined in the recipe.

At 506, the parameters representing the estimated shape, together with the one or more optical properties of the different elements of the model, are used to calculate one or more scattering properties, for example using a rigorous optical diffraction method such as RCWA or any other solver of Maxwell equations. This gives an estimated or model diffraction pattern of the estimated target shape.

At 508, 510, the measured diffraction pattern and the model diffraction pattern are then compared and their similarity and/or difference are used to calculate a "merit function" for the model target shape.

At 512, assuming that the merit function indicates that the model needs to be improved before it represents accurately the actual target shape, one or more new parameters $p_1^{(1)}$, $p_2^{(1)}$, $p_3^{(1)}$, etc. are estimated and fed back iteratively into step 506. Steps 506-512 are repeated.

In order to assist the search, the calculations in step 506 may further generate partial derivatives of the merit function, indicating the sensitivity with which increasing or decreasing a parameter will increase or decrease the merit function, in this particular region in the parameter space. The calculation of merit functions and the use of derivatives is generally known in the art, and will not be described here in detail.

At 514, when the merit function indicates that this iterative process has converged on a solution with a desired accuracy, the currently estimated one or more parameters are reported as the measurement of the actual target structure.

The computation time of this iterative process is largely determined by the forward diffraction model used, i.e. the calculation of the estimated model diffraction pattern using a rigorous optical diffraction theory from the estimated target structure. If more parameters are required, then there are more degrees of freedom. The calculation time increases in principle with the power of the number of degrees of freedom. The estimated or model diffraction pattern calculated at 506 can be expressed in various forms. Comparisons are simplified if the calculated pattern is expressed in the same form as the measured pattern generated in step 502 For example, a modelled spectrum can be compared easily with a spectrum measured by the apparatus of FIG. 3; a modelled pupil pattern can be compared easily with a pupil pattern measured by the apparatus of FIG. 4.

Throughout this description from FIG. 5 onward, the term 'diffraction pattern' will be used on the assumption that the scatterometer of FIG. 4 is used. The skilled person can readily adapt the teaching to different types of scatterometer, or even other types of measurement instrument.

Figure 6:
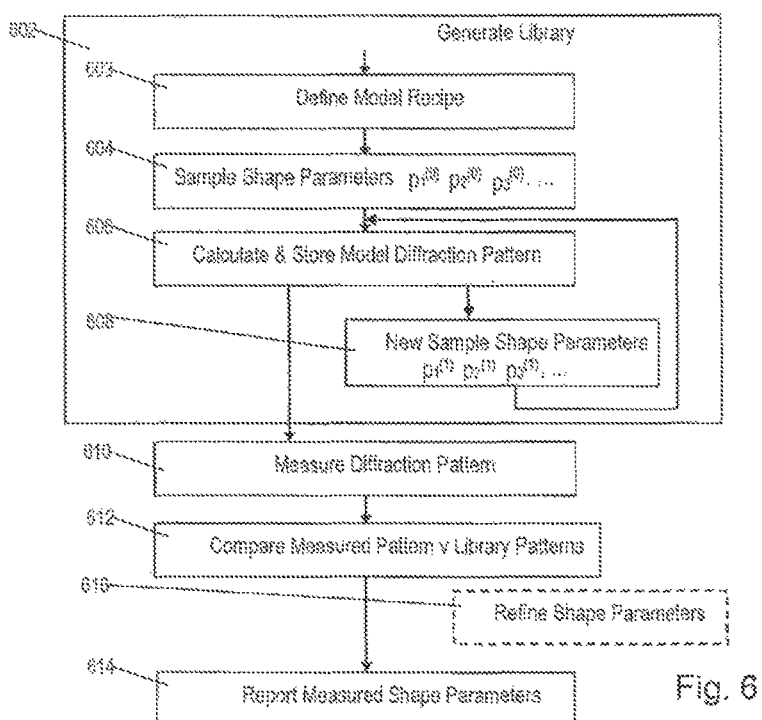
FIG. 6 depicts a further example process for reconstruction of a structure from scatterometer measurements.

FIG. 6 illustrates a further example process in which a plurality of model diffraction patterns for different estimated target shapes (candidate structures) are calculated in advance and stored in a library for comparison with a real measurement. The underlying principles and terminology are the same as for the process of FIG. 5. The steps of the FIG. 6 process are:

At 602, the process of generating the library begins. A separate library may be generated for each type of target structure. The library may be generated by a user of the measurement apparatus according to need, or may be pre-generated by a supplier of the apparatus.

At 603, a 'model recipe' is established which defines a parameterized model of the target structure in terms of a number of parameters $p_i$ ($p_1$, $p_2$, $p_3$ and so on). Considerations are similar to those in step 503 of the iterative process.

At 604, a first set of parameters $p_1^{(0)}$, $p_2^{(0)}$, $p_3^{(0)}$, etc. is generated, for example by generating random values of each of the parameters, each within its expected range of values.

At 606, a model diffraction pattern is calculated and stored in a library, representing the diffraction pattern expected from a target shape represented by the one or more parameters.

At 608, a new set of shape parameters $p_1^{(1)}$, $p_2^{(1)}$, $p_3^{(1)}$, etc. is generated. Steps 606-608 are repeated tens, hundreds or even thousands of times, until the library which comprises all the stored modelled diffraction patterns is judged sufficiently complete. Each stored pattern represents a sample point in the multi-dimensional parameter space. The samples in the library should populate the sample space with a sufficient density that any real diffraction pattern will be sufficiently closely represented.

At 610, after the library is generated (though it could be before), the real target 30 is placed in the scatterometer and its diffraction pattern is measured.

At 612, the measured pattern is compared with one or more modelled patterns stored in the library to find the best matching pattern. The comparison may be made with every sample in the library, or a more systematic searching strategy may be employed, to reduce computational burden.

At 614, if a match is found then the estimated target shape used to generate the matching library pattern can be determined to be the approximate object structure. The one or more shape parameters corresponding to the matching sample are output as the one or more measured shape parameters. The matching process may be performed directly on the model diffraction signals, or may be performed on a substitute model which is optimized for fast evaluation.

At 616, optionally, the nearest matching sample is used as a starting point, and a refinement process is used to obtain the one or more final parameters for reporting. This refinement process may comprise an iterative process very similar to that shown in FIG. 5, for example.

Whether refining step 616 is used or not is a matter of choice for the implementer. If the library is very densely sampled, then iterative refinement may not be needed because a good match may always be found. On the other hand, such a library might be too large for practical use. A practical solution is thus to use a library search for a coarse set of parameters, followed by one or more iterations using the merit function to determine a more accurate set of parameters in order to report the set of parameters of the target substrate with a desired accuracy. Where additional iterations are performed, it would be an option to add the calculated diffraction patterns and associated refined parameter sets as new entries in the library. In this way, a library can be used initially which is based on a relatively small amount of computational effort, but which builds into a larger library using the computational effort of the refining step 616. Whichever scheme is used, a further refinement of the value of one or more of the reported variable parameters can also be obtained based upon the goodness of the matches of multiple candidate structures. For example, the set of parameter values finally reported may be produced by interpolating between parameter values of two or more candidate structures, assuming both or all of those candidate structures have a high matching score.

The computation time of this iterative process is largely determined by the forward diffraction model at steps 506 and 606, i.e. the calculation of the estimated model diffraction pattern using a rigorous optical diffraction theory from the estimated target shape.

As the dimensions of features made using lithography become smaller, lithography is becoming a more critical factor for enabling miniature IC or other devices and/or structures to be manufactured. A theoretical estimate of the limits of pattern printing can be given by the Rayleigh criterion for resolution as shown in equation (1):

$$CD = k_1 * \frac{\lambda}{NA} \quad (1)$$

where $\lambda$ is the wavelength of the radiation used, NA is the numerical aperture of the projection system used to print the pattern, $k_1$ is a process dependent adjustment factor, also called the Rayleigh constant, and CD is the feature size (or critical dimension) of the printed feature. It follows from equation (1) that reduction of the minimum printable size of features can be obtained in three ways: by shortening the exposure wavelength $\lambda$, by increasing the numerical aperture NA or by decreasing the value of $k_1$.

In order to shorten the exposure wavelength and, thus, reduce the minimum printable size, it has been proposed to use extreme ultraviolet (EUV) radiation. EUV radiation is electromagnetic radiation having a wavelength within the range of 5-20 nm, for example within the range of 13-14 nm. It has further been proposed that EUV radiation with a wavelength of less than 10 nm could be used, for example within the range of 5-10 nm such as 6.7 nm or 6.8 nm. Such radiation is termed extreme ultraviolet radiation or soft x-ray radiation. Possible sources include, for example, laser-produced plasma sources, discharge plasma sources, or sources based on synchrotron radiation provided by an electron storage ring.

One possible way of enabling use of diffraction-based metrology in EUV systems is to use a phase shift patterning device. Such a phase shift patterning device comprises trenches (or other phase shift features) which create a phase shift in the redirected beam so as to deflect the radiation beam off-axis. The degree of phase shift (and therefore degree of deflection) is dependent upon the degree of defocus. The resultant target may comprise first structures which are printed via patterning device features not having trenches, and therefore are printed at a position on the substrate which is independent of focus, and second structures which are printed via patterning device features having trenches, and therefore are printed at a position on the substrate which is dependent of focus. In this way the position of the second structures (with reference to the first structures) is focus dependent. However, such an arrangement may not desirable as it may require a complex and difficult to manufacture patterning device.

The measurement method proposed herein makes use of a modified version of an interlaced scatterometer overlay target for use with double patterning overlay measurements. The modified target is a combination of this interlaced overlay target and the focus calibration marks described above.

Figure 7A:
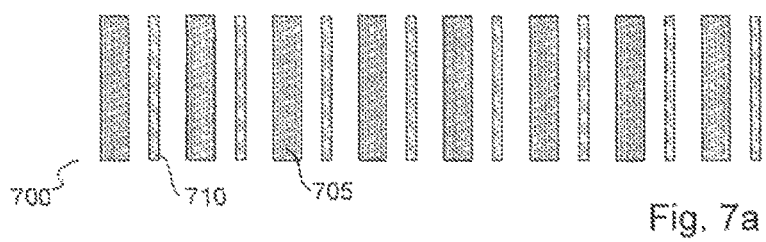
FIG. 7a schematically depicts an interleaved overlay target.

FIG. 7a shows an interlaced scatterometer overlay target 700, which comprises alternating first structures 705 and second structures 710. Neither first nor second structures 705, 710 are deliberately focus dependent. Specifically in this example, the printed line asymmetry of first and second structures 705, 710 is not focus sensitive. There will of course always be some focus dependency in the formation of any feature (e.g. its profile will change as a function of focus), which is precisely why focus control is significant in lithographic processes.

Figure 7B:
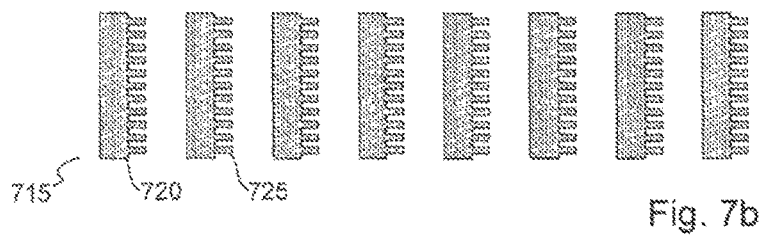
FIG. 7b schematically depicts a diffraction based focus (DBF) measurement target.

FIG. 7b illustrates a DBF target 715 configured for diffraction based focus (DBF) measurements. It comprises plural DBF structures 720, each of which comprises high resolution substructures 725. The high resolution substructures 725 on top of a base pitch creates an asymmetric resist profile for each DBF structure 720, with the degree of asymmetry being dependent upon focus. Consequently a metrology tool can measure the degree of asymmetry from such a DBF target 715 and translate this into the scanner focus.

While the DBF target 715 enables diffraction based focus measurements, it may not be suitable for use in all situations. EUV resist film thicknesses are significantly smaller than those used in immersion lithography which makes it difficult to extract accurate asymmetry information from the asymmetric profile of the structures forming part of a target. In addition such structures may not comply with the strict design constraints applicable to certain product structures. During the device making process all features of a pattern of the patterning device should print and stand up to subsequent processing steps. Device manufacturers use design rules as a means to restrict the feature designs to help ensure the printed features conform to their process requirements. One such design rule relates to the allowable size of structures. Another such design rule is pattern density, which restricts the density of a resulting resist pattern to be within a particular range.

Pattern density is closely correlated to defectivity since polish and diffusion steps may require a certain level of uniformity to avoid generating defects. This is significant in (for example) a spacer process where a thin layer is deposited over the resist features, and further process steps reduce the features to small lines wherever resist edges were once present. Achieving minimum pattern density requirements after a spacer process means it may not be possible to use large features since only the resist edges are transferred to the substrate as thin lines. In this regard the DBF structures 720 of DBF target 715 may be too large. Therefore, to increase spacer process pattern density, the number of resist pattern edges may need to be increased.

Metrology features should also comply with these design rules since they might otherwise become a source for defects. Metrology targets should therefore be composed of small features yet still be able to generate a signal that the metrology tool can detect given limitations in wavelength and capture angle. For the DBF targets 715 the resulting pattern density after a spacer process may be significantly too small.

Figure 7C:
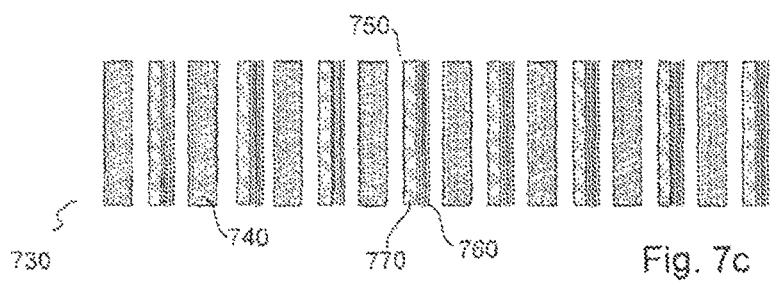
FIG. 7c schematically depicts a target according to an embodiment of the invention.

FIG. 7c illustrates a modified target 730 in accordance with an embodiment of the invention. Target 730 comprises first structures 740 and second structures 750. First structures 740 are not focus dependent and are essentially similar to first structures 705 of FIG. 7a. Second structures 750 comprise high resolution substructures 760 and a low resolution substructure 770. High resolution substructures 760 should have a width smaller than 200 nm, so as not to be detected as individual structures by a scatterometer. In various embodiments, the high resolution substructures 760 may all have widths smaller than 100 nm, smaller than 50 nm or smaller than 25 nm. In an embodiment the high resolution substructures 760 and low resolution substructure 770 may both have similar CDs; for example the low resolution substructure 770 may be only 10-40 nm wider than the high resolution substructures 760.

The effect of the high resolution of the substructures 760 is that they only print on the substrate when the radiation beam used to print the target 730 is within a best focus region. Outside of the best focus region (i.e. when the beam is defocussed) substructures 760 (or parts of them) do not print. Consequently, the form of the printed second structures 750 depends upon the focus of the radiation beam. This is in contrast to the targets resultant from a phase shift mask described above, for which it is the position, not the form, of the second structures that are focus dependent. In this way, a more conventional patterning device can be used, without the need for trenches or similar features for altering phase.

The change in form of the second structures 750 may manifest itself in a shift in their center of gravity (CoG) which may be detected as pupil asymmetry by the scatterometer. The CoG shift can be calibrated against a programmed focus offset substrate. By exposing a substrate with known focus offsets one can calibrate the behavior of the designed target (as detected by a scatterometer) as a function of focus. The result is a curve similar to curve 1100 in FIG. 11. With this calibrated curve, substrates can be exposed at best focus and the measured scatterometer response can be compares against curve 1100 to determine focus position for each measurement on the substrate.

In addition, the presence of first structures 740 between the second structures 750 increases the pattern density compared to the DBF target 715.

Figure 7D:
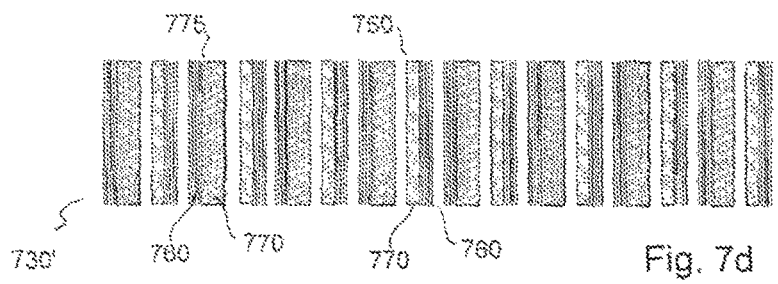
FIG. 7d schematically depicts a target according to a further embodiment of the invention.

FIG. 7d shows a target 730' comprising first structures 775 and second structures 750 which are both focus dependent, as both comprise high resolution substructures 760 and a low resolution substructure 770. The focus dependence of first structures 775 is made to differ from the focus dependence of second structures 750 by the high resolution substructures 760 being on one side of low resolution substructure 770 for the first structures 775, and on the opposite side of low resolution substructure 770 for the second structures 750. In this way the CoG shift through focus for first structures 775 and second structures 750 will be in the opposite direction.

Target 730, 730' shows high resolution substructures 760 which comprise a number of high resolution bars, each of similar linewidth (in the region of 15-25 nm; e.g., 22 nm), and extending in the same direction as first structure 740 and low resolution substructure 770. However, other configurations are possible.

FIG. 8 shows a detail of example further configurations of second structure 750. In each case a single example of a first structure 810, 810' and second structure 850, 850', 850" is shown. To make a target, these pairs of structures are repeated several times in a similar manner as shown in FIG. 7c, or as shown in FIG. 7d in the example of FIG. 8(d).

Figure 8A:
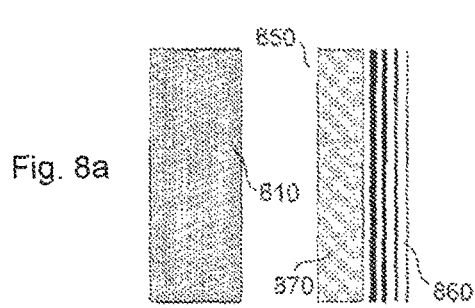
FIGS. 8a, 8b, 8c an 8d each schematically depicts a detail of an alternative target configuration according to further embodiments of the invention.

FIG. 8(a) shows a second structure 850 similar to second structure 750, except that the high resolution substructures 860 vary in resolution (linewidth), going from lower resolution to higher resolution in the direction away from low resolution substructure 870. This provides increased variation in the form of second structure 850 through focus, in that a small degree of defocus will mean that only the high resolution substructure(s) 860 having the highest resolution will fail to print, with the number of high resolution substructures 860 which fail to print increasing as the degree of defocus increases. This means that there are a number of different focus dependent forms which the second structure 850 may take, and therefore a number of possible center of gravity shifts in the second structure 850, depending on the degree of defocus. The smallest of the high resolution substructures 860 may be as narrow as the lithographic apparatus resolution allows.

In an embodiment the widths of high resolution substructures 860 vary between 15 nm and 25 nm. High resolution substructures 860 may all have different linewidths, or may comprise adjacent substructures of the same linewidth. For example, while the high resolution substructures 860 may be arranged in order of decreasing linewidth as described in the previous paragraph, this arrangement may include some (e.g., the two thinnest) adjacent high resolution substructures 860 having the same linewidth.

FIG. 8(*b*) shows a second structure 850' comprising horizontal substructures 860', extending in a direction normal to that of low resolution substructure 870. The second structure 850' is essentially the same as DBF structure 720 in FIG. 7*b*. These structures show a line end (tip-to-tip) focus response to create a CoG shift of second structure 850' as a function of focus. As all the horizontal substructures 860' have the same CD at the patterning device, the right hand side of the line ends "pull back" as a function of defocus, such that the length of each substructure 860' varies with defocus: the greater the degree of defocus, the shorter that each horizontal substructure 860' will be.

There can be an advantage in having vertical substructures or horizontal substructures, depending on the application. One or the other may be more sensitive to process variation, dose variation or a specific aberration. When considering target designs that behave as close as possible to the actual product (w.r.t. focus and aberration sensitivity) one could consider any designs illustrated in FIG. 7 or FIG. 8, or any other design falling within the scope of the claims.

FIG. 8(*c*) shows a second structure 850" comprising substructures 860" which essentially combine the concepts of substructure 860 and substructure 860'. Second structure 850" comprises a two dimensional array of substructures 860", arranged such that the width of each substructure 860" decreases in the horizontal direction. Such an arrangement can potentially create product-like aberration sensitivity.

FIG. 8(*d*) shows a second structure 850 essentially similar to that illustrated in FIG. 8(*a*) adjacent to a first structure 810' comprising high resolution substructures 880. High resolution substructures 880 are similar to high resolution substructures 860, but arranged in the opposite direction (thin to thick in comparison with thick to thin). High resolution substructures 880 are also on the opposite side of low resolution substructure 890, in comparison to high resolution substructures 860 relative to low resolution substructure 870.

Figure 8B:
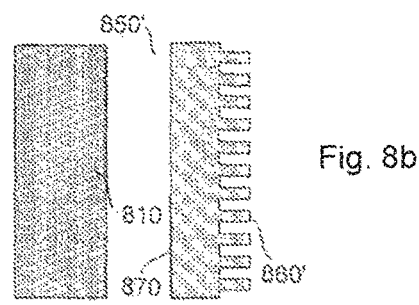
Figure 8C:
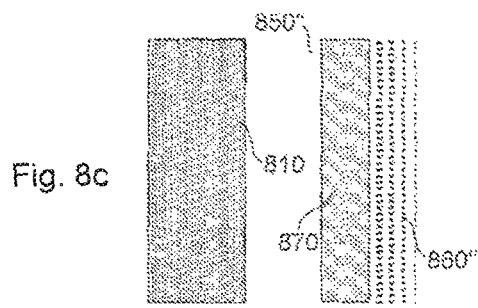
Figure 8D:
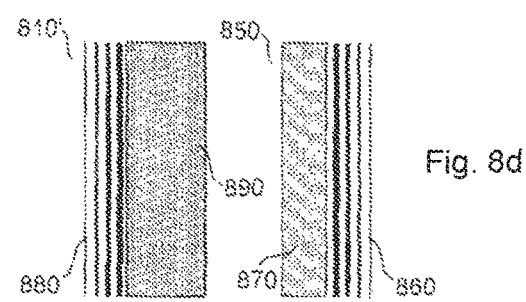
Figure 9:
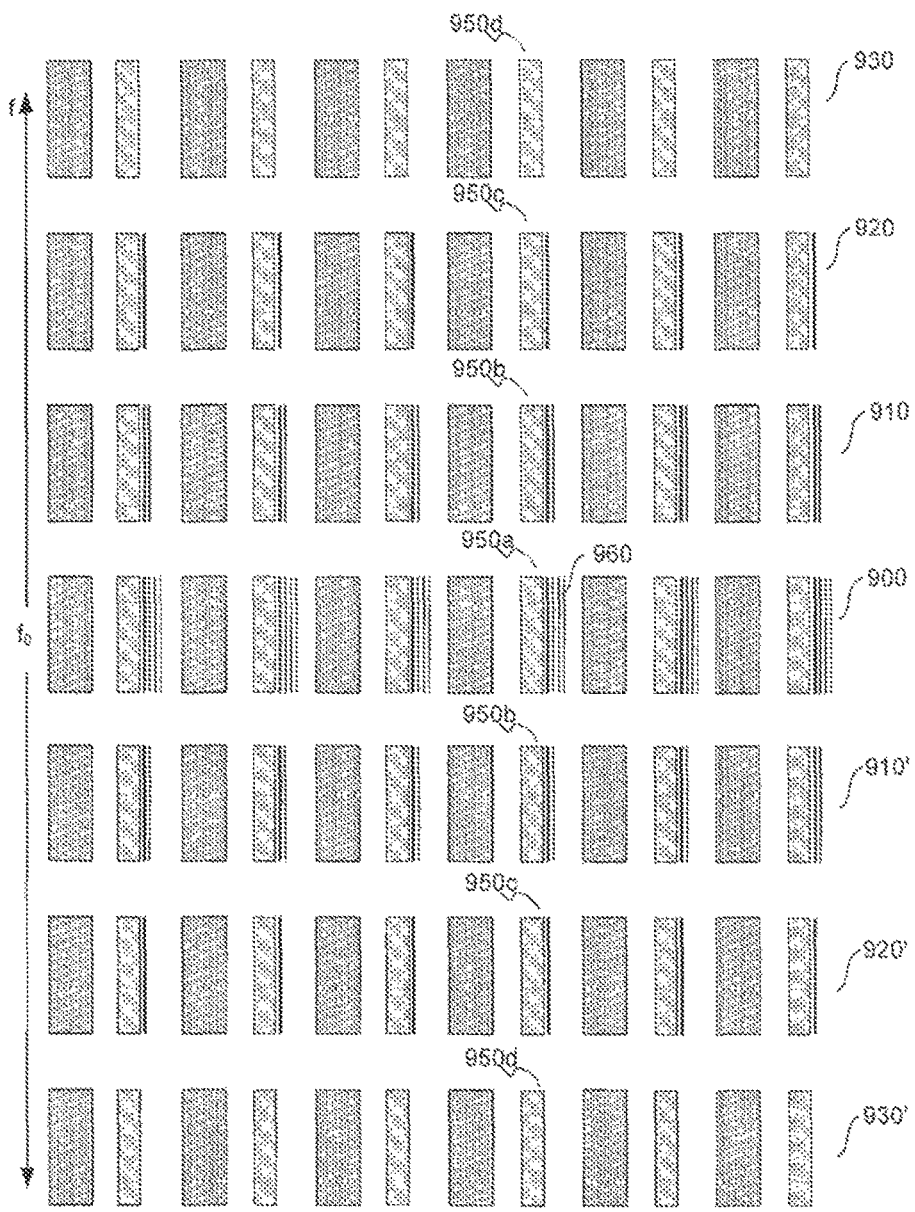
FIG. 9 schematically depicts a number of targets which have been exposed at different focus settings.

FIG. 9 shows a target 900 having second structures 950*a* of the type shown in FIG. 8(*a*), printed at best focus $f_0$ and targets 910, 910', 920, 920', 930, 930' printed at different degrees of defocus, and having second structures 950*b*, 950*c*, 950*d*. Target 900 has all high resolution substructures 960 printed, even those with the highest resolution. Targets 910 and 910', each of which being printed with a degree of defocus of the same magnitude but different sign with reference to best focus $f_0$, have second structures 950*b* with fewer high resolution substructures 960 printed. This pattern is repeated for targets 920, 920' and targets 930, 930'; in each case as the magnitude of the degree of defocus increases, the number of printed high resolution substructures 960 decreases.

Figures 10A, 10B:
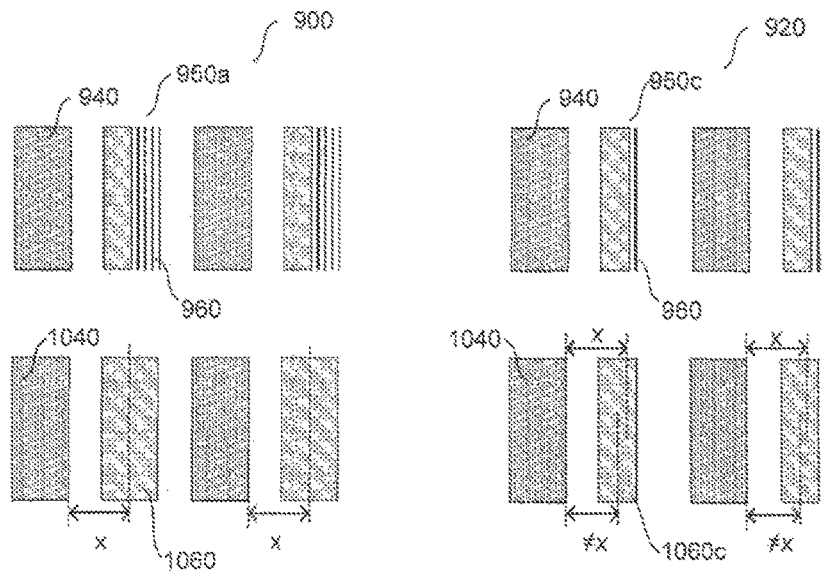
FIGS. 10a and 10b schematically depicts a detail of two targets exposed at best focus (FIG. 10a) and with a degree of defocus (FIG. 10b), and an approximation of what a scatterometer will detect as a result.

FIG. 10 illustrates the center of gravity shift between (a) the printed second structure 950*a* of target 900 and (b) the printed second structure 950*c* of target 920 (or 920'). In each case the top drawing shows the actual printed target 900, 920, while the bottom drawing shows an approximation of what a scatterometer inspecting each target 900, 920 effectively "sees" (i.e., detects) following modeling/analyzing of the actual scatterometry signal. In the bottom drawing it can be seen that the second structures 950*a*, 950*c* are seen by the scatterometer as effective structures 1060, 1060*c* having a width dependent on the number of high resolution substructures 960 printed. In FIG. 10(*a*) the center of gravity of the seen first effective structure 1060 (referenced to the corresponding first structure 1040) is labelled x. In FIG. 10(*b*) the center of gravity of seen second effective structure 1060*c* can be seen not to equal x.

The center of gravity shift is detectable by the scatterometer as an asymmetry between positive and negative diffraction orders of the diffracted radiation. Therefore detected asymmetry is an indication of focus and consequently, by using a scatterometer to measure the asymmetry, the focus used to print the target may be determined. The asymmetry of the target will affect the diffraction pattern for corresponding positive and negative diffraction orders. If there is no asymmetry in a target, then the positive and negative diffraction orders will have the same spectral profile. Analysis of the differences in the spectral components of the positive and negative diffraction orders can be used to determine the asymmetry of the target. The phrase "positive and negative diffraction orders" refers to any of the $1^{st}$ and higher diffraction orders. Diffraction orders include zeroth order (specular reflection) which is neither positive nor negative, and then higher orders which exist in complementary pairs, conveniently referred to as positive and negative. Non-zero orders can be referred to as higher orders. Thus, $+1^{st}$ order and $-1^{st}$ order are examples of positive and negative orders, as are $+2^{nd}$ and $-2^{nd}$, $+3^{rd}$ and $-3^{rd}$ and so forth. The examples will be illustrated primarily with reference to $+1^{st}$ and $-1^{st}$ orders, without limitation.

Figure 11:
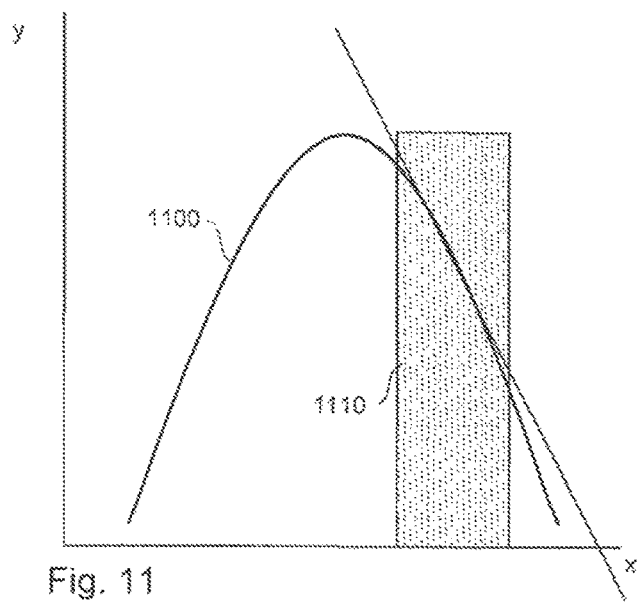
FIG. 11 is a plot of asymmetry or center of gravity on the y-axis and focus on the x-axis which serves to illustrate how to obtain focus sign information.

FIG. 11 is a plot 1100 of asymmetry or center of gravity on the y-axis and focus on the x-axis which serves to illustrate how to obtain focus sign information. In FIG. 9, it can be seen that the printed targets 910 and 910' are indistinguishable, as are targets 920 and 920' and targets 930 and 930'. For each pair, the magnitude of the degree of defocus is the same, but the sign is different. This uniqueness problem means that a method to extract focus sign information is desirable. The method comprises exposing the substrate purposely off-focus with a known offset so that all the focus values are on one side of the peak of plot 1100. For example, the known focus offset will mean that all measured focus values are within region 1110. The known focus offset can then be taken away from the measured focus values to find the actual focus values with correct sign.

The proposed method may comprise a calibration process followed by a monitor and control process. The calibration process comprises exposing a focus exposure matrix (FEM) substrate and measuring higher order asymmetry as a function of focus so as to calculate a focus calibration curve. The FEM substrate may be used as a calibration substrate for a scatterometer. As is known in the art, a FEM substrate comprises a substrate that has been coated with a photoresist onto which a pattern is exposed with multiple combinations of focus and exposure offsets. The monitor and control process may comprise exposing a monitor substrate off-focus (to obtain sign information as described above) and measuring higher order asymmetry. This measured higher order asymmetry can then be converted to focus using the focus calibration curve calculated during the calibration process.

To determine the calibration curve from the monitor substrate, a number of fields may be exposed with programmed focus offsets (e.g., Rx tilt). This reduces process dependency.

Because of the need to expose the monitor substrate off-focus, the method is more easily applicable to off-product measurement. It is clearly undesirable to expose on-product while purposely off-focus. However, the method may be adapted for on-product focus control by providing a target design which has a patterning device topography that takes advantage of three-dimensional mask (M3D) effects. The mask patterning device may be such that during exposure, the product structures are formed in focus and the target is formed out of focus with a focus offset. Such a mask patterning device may comprise M3D features (such as, for example, scatter bars) to create M3D induced best focus offsets to the target, with respect to the product features being exposed at best focus. In an embodiment the M3D features may comprise the high resolution substructures of previous embodiments. These targets having focus-dependent M3D features can then be measured and the focus determined, in a manner similar to that already described, taking into account the best focus offset resultant from the M3D effect.

FIGS. 12 and 13 illustrate a further method for obtaining sign information. To understand this method it should be appreciated that the focus response of the interlaced targets described above is actually a combination of the printed asymmetric line response (which is approximately linear as a function of focus) and the interlaced target design (difference in center of gravity (CoG) between the two structure populations). This is illustrated by FIG. 12(a) and FIG. 13a. FIG. 12(a) is an interlaced target design 1200 as already discussed, in particular in relation to FIG. 8(b) (although this concept is applicable to any of the other interlaced target designs described herein). The target 1200 comprises first structures 1210 and second structures 1220. First structures may be, for example, of any form disclosed herein. Second structures 1220 are shown here as being similar to DBF structures 720 (FIG. 7b) or second structures 870 in FIG. 8(b). Curve 1330 of FIG. 13a is the resultant signal response (y-axis) through focus (x-axis). This curve 1330 comprises the sum of curve 1310, which represents the signal response to focus due to CoG shift of target 1200 and line 1320, which represents the signal response to focus due to the asymmetry of the second structures 1220.

It is proposed to solve the sign issue of target 1200 by combining signals of multiple (interlaced) targets. By changing the design properties of e.g. the asymmetric line, while keeping the symmetric line segment placement with respect to the asymmetric line identical, the uniqueness problem can be addressed. Such a target 1230 is illustrated in FIG. 12(b). The target comprises a fourth structure 1240 which is different in form to second structure 1220, but is of the same basic design, the difference relating to parameters such as line width and/or length of the high definition features. The relative placement of third structures 1250 (which are essentially the same as first structures 1210) and fourth structures 1240 in target 1230 is similar to the relative placement of first structures 1210 and second structures 1220 in target 1200.

As can be seen in FIG. 13b, the Bossung type behavior of the interlaced targets 1200 and 1230 remains similar, as shown by the similarity of curves 1310 and 1340 (where curve 1340 represents the signal response to focus due to CoG shift of target 1230), whereas the asymmetric line content 1350 changes as the form of fourth structure 1240 differs from that of second structure 1220. The resultant focus response curve 1360 is also shown. Effectively this means that the Bossung top of the different interlaced targets 1200, 1230 will shift with respect to each other. The uniqueness issue can then be addressed by:

finding the difference of both asymmetry signals 1330, 1350 as illustrated in FIG. 13c—the resulting signal 1360 will depend on the similarity between Bossung-like behavior of the CoG signal and the difference of the asymmetry line signal; and/or by making a (multi-variate) Focus (Dose) model of both targets 1200, 1230.

It should be noted that in principle the third and fourth structures may be dissimilar to the first and second structures. In principle the placement of the third and fourth structures may be dissimilar to that of the first and second structures.

Additionally, a best focus offset can be preselected into the target response by performing an optimization procedure of the asymmetric structure response and placement of interlaced line structures. This method of designing for a Bossung top offset may be preferred to that of using M3D effects as described above, as the M3D effects are unpredictable and can vary from patterning device to patterning device, and across the patterning device pattern.

This direct method of obtaining sign information (as illustrated in FIG. 13c) is more applicable to non-EUV applications (thicker resists) where the asymmetry of the structure is more prominent. In such thicker resist applications, a main reason for using interlaced targets is to increase pattern density. The pre-selection of a best focus offset can be used in EUV, thin resist applications, using the sign extraction method as illustrated in FIG. 11. In principle, however, the best focus offset method works for any measurement in which the best focus setting is an optimization parameter (so also for non-EUV applications). A typical application could be a monitor type application. For on-product applications, the best focus settings are determined by the user's process, and thus a focus measurement solution should be devised that works at the user specified conditions.

It is mentioned above that the DBF target 715 shown in FIG. 7b may not meet pattern density requirements of certain design rules. In order to increase the pattern density, the target design may be changed either by reducing the base pitch or adding in dummy features within the target. Reducing the base pitch however is likely not viable since this will cause the diffraction orders used by the metrology tool to spread beyond the resolution of the current optics. To address this, as already described, it is proposed to provide further structures (such as first structures 810 in FIG. 8) between the DBF structures 720. However, the printing of these first structures is also difficult since the high resolution features 725 which create the asymmetric resist profile limit space available on the patterning device for the first structures. A different method is therefore desirable for printing a target which contains both pattern profile asymmetry at a pitch captured by the metrology tool and the required pattern density.

It is therefore proposed to generate the second structures 720 and first structures 810 in two separate exposures, without the need for a second patterning device or second patterning device pattern. This method is illustrated in FIGS. 14a and 14b.

Figure 14A:
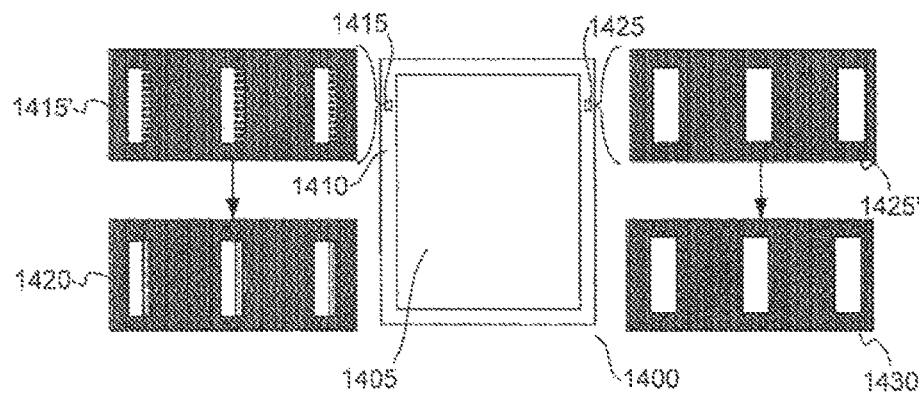
FIGS. 14a and 14b illustrate a method of generating a first set of structures and a second set of structures in two separate exposures, without the need for a second patterning device or second patterning device pattern.

FIG. 14a shows a patterning device 1400 region, comprising a main product area 1405 and a scribe area 1410 at the periphery of the main product area 1405 (for clarity the scribe area 1410 is shown larger relative to the main product area 1405 than it really is). In the scribe area 1410, on one side of the main product area, are the second structures 1415. Also shown is a detail of the second structures 1415' and the structures 1420 which will actually be printed on the substrate following exposure of the second structures 1415. In the scribe area 1410, directly opposite the second structures 1415 on the other side of the main product area 1405, are the first structures 1425. Again there is shown a detail of the first structures 1425' and the structures 1430 which will actually be printed on the substrate following exposure of the first structures 1425.

Figure 14B:
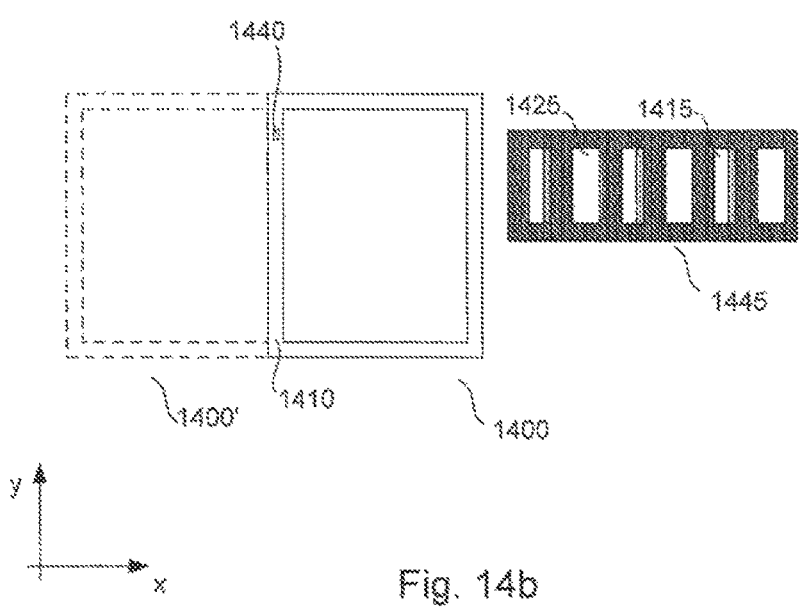

FIG. 14b shows how the complete structure is printed. It shows the patterning device 1400 region in position for exposure on a substrate. It also shows (dotted) the patterning device 1400' region in its relative previous position for exposure immediately preceding the present exposure. When exposing the product onto a substrate, it is exposed such that the scribe lane area 1410 on one side of the product area overlaps the scribe lane area 1410 on the opposite side of the product area of the previous exposure. Provided that the second structures 1415 and first structures 1425 are correctly positioned on opposite sides of the product area on the patterning device pattern, and directly opposing one another (around the y-axis only), their areas overlap 1440 during each pair of exposures (on the same row). Of course the second structures 1415 and first structures 1425 should be positioned so that the individual structures alternate within the area of overlap 1440, such the resultant printed structures 1445 take the correct form with the second structures 1415 and first structures 1425 being interlaced.

It should be noted that such a method involves a darkfield (negative) exposure as illustrated in the drawings (where dark areas indicate resist, the resultant target being a trench-type target). This is because there would be no resist remaining on the substrate between the structures after the first exposure of a conventional target, from which to form the second structures.

FIGS. 14a and 14b depict the interlacing of symmetric and asymmetric structures, and in particular structures of a form shown in FIG. 8(b). However, this method may be used to print any of the target structures disclosed herein. Additionally, it is also possible to interlace other features and/or arrays of smaller features using the same method.

In another embodiment, the first structures may be dummy structures. In such an arrangement the dummy structures are not used to generate a CoG shift as described above, the focus measurements being taken from the asymmetry of the second structures only. The resulting printed structures, with such dummy structures, will have both the required pattern density and asymmetric profile at a pitch within the capture window of the metrology tool. The dummy structures may take any form (for example very high resolution multiple lines between each pair of the second structures).

The use of this method for increasing pattern density is not restricted to DBF metrology but can be applied to any metrology feature to increase pattern density, and for example any metrology feature that makes use of a specific imaging effect printed at a relaxed pitch.

At its widest, this section discloses a method of printing a compound structure via one or more patterning devices or patterning device patterns, wherein the method comprises:

performing a first exposure onto a substrate, wherein the first exposure comprises printing first printed structures from first patterning device structures located on a first patterning device or a first patterning device pattern; and performing a second exposure onto a substrate, adjacent to the first exposure and such that there is a region of overlap of the first exposure and second exposure on the substrate, the region of overlap comprising the first printed structures, wherein the second exposure comprises printing in the region of overlap on the substrate, second printed structures from second patterning device structures located on the first patterning device or first patterning device pattern or on a second patterning device or second patterning device pattern, thereby forming the compound structure.

The patterning device or patterning device pattern may comprise a product area, and peripheral to the product area, a scribe line area, and the first patterning device structures, and second patterning device structures may be located in the scribe lane area of the patterning device or patterning device pattern, or the scribe lane area of a different patterning device or patterning device pattern. The first patterning device structures may be located at a first side of the scribe lane area, and second patterning device structures may be located on a side opposite the first side of the product area, such that the first patterning device structures are located directly opposite (relative to a single axis) the second patterning device structures.

Also disclosed is a patterning device comprising a product area, and peripheral to the product area, a scribe line area, the patterning device further comprising first patterning device structures, and second patterning device structures located within the scribe lane area of the patterning device; the first patterning device structures being located at a first side of the scribe lane area, and second patterning device structures being located on a side opposite the first side of the product area, such that the first patterning device structures are located directly opposite (relative to a single axis) the second patterning device structures.

Embodiments are disclosed in the subsequent numbered clauses:

1. A method of obtaining focus information relating to a lithographic process, the method comprising:

illuminating a first target, the first target comprising alternating first and second structures, the form of the second structures being focus dependent such that its form depends upon the focus of a patterned beam used to form the first target and the form of the first structures not having the same focus dependence as that of the second structures; and detecting radiation scattered by the first target to obtain for that first target an asymmetry measurement representing an overall asymmetry of the first target, the asymmetry measurement being indicative of the focus of the patterned beam when forming the first target.

2. The method of clause 1, wherein the form of the first structures has no deliberate dependence upon the focus of the patterned beam when forming the first target.

3. The method of clause 1, wherein the form of the first structures is dependent upon the focus of the patterned beam when forming the first target, the focus dependence being different to that of the second structures.

4. The method of clause 3, wherein the focus dependence differs for the first and second structures such that a focus shift causes shifts in a center of gravity of the first structures and the second structures which are in opposite directions.

5. The method of any of clauses 2 to 4, wherein a patterning device is used to produce the patterned beam, the patterning device comprising first structure features to form the first structures and second structure features to form the second structures, wherein:

the first structure features and the second structure features both comprise a low resolution substructure feature to form low resolution substructures; and the second structure features and, where the form of the first structures is focus dependent, the first structure features comprise a high resolution substructure feature to form high resolution substructures such that the number and/or size of high resolution substructures in the first target depends upon the focus of the patterned beam when forming the first target.

6. The method of clause 5, wherein the linewidth of the low resolution substructures is between 10 nm and 50 nm greater than the linewidth of the high resolution substructures.

7. The method of clause 5 or clause 6, wherein the high resolution substructures comprise a plurality of elongate high resolution substructures extending in a direction normal to that of the low resolution substructures.

8. The method of clause 5 or clause 6, wherein the high resolution substructures comprise a plurality of elongate high resolution substructures arranged parallel to the low resolution substructures.

9. The method of clause 5 or clause 6, wherein the high resolution substructures comprise a two dimensional array of high resolution substructures.

10. The method of any of clauses 5 to 9, wherein the high resolution substructures comprise high resolution substructures having different linewidths.

11. The method of clause 10, wherein the high resolution substructures are arranged in order of decreasing linewidth from the low resolution substructure.

12. The method of any of clauses 5 to 11, wherein the high resolution substructures each have a linewidth less than 50 nm.

13. The method of any of clauses 5 to 12, wherein the patterning device comprises mask effect features which cause a three-dimensional mask effect such that the first target is formed with a best focus which is offset from a best focus for product features on the patterning device.

14. The method of clause 13, wherein the mask effect features comprise one or more of the high resolution substructures.

15. The method of any of clauses 5 to 12, wherein the first target is configured such that the asymmetry measurement comprises a first asymmetry component resultant from a center of gravity shift between the first structures and the second structures, and a second asymmetry component resultant from asymmetry in the profile of the second structures, and wherein the first target is formed with a best focus which is offset from a best focus for product features on the patterning device, the best focus offset resulting from the second asymmetry component.

16. The method of clause 15, further comprising optimizing the best focus offset through variations of the second structure profile and the relative placement of the first structures and the second structures.

17. The method of any preceding clause, further comprising illuminating at least a second target, the second target comprising third and fourth structures, the fourth structures having at least one parameter different to the second structures.

18. The method of clause 17, wherein the placement of the third structures relative to the fourth structures in the second target is similar to the placement of the first structures relative to the second structures in the first target.

19. The method of clause 17 or clause 18, further comprising:

detecting radiation scattered by the second target to obtain for the second target a second asymmetry measurement;

determining the difference of the second asymmetry measurement and the asymmetry measurement from the first target; and using the difference to determine the sign of a focus determination.

20. The method of clause 17 or clause 18, further comprising:

constructing a multi-variate focus model of the first and second targets; and using the model to determine the sign and/or value of a focus determination.

21. The method of any of clauses 5 to 20, further comprising forming the first target in at least two exposures, the forming comprising:

performing a first exposure onto a substrate, wherein the first exposure comprises forming the first structures or the second structures; and performing a second exposure onto the substrate, adjacent to the first exposure and such that there is a region of overlap of the first exposure and second exposure on the substrate, the region of overlap comprising the formed first structures or formed second structures, wherein the second exposure comprises forming in the region of overlap on the substrate, the other of the first structures or the second structures, thereby forming the first target.

22. The method of clause 21, wherein the first and second structures comprise trenches in photoresist.

23. The method of clause 21 or clause 22, wherein the patterning device comprises a product area, and peripheral to the product area, a scribe line area, and the first structure features and the second structure features are located in the scribe lane area.

24. The method of clause 23, wherein the first structure features are located at a first side of the scribe lane area, and the second structure features are located on a side opposite the first side of the product area, such that the first structure features are located directly opposite, relative to a single axis, of the second structure features.

25. The method of any preceding clause further comprising using the asymmetry measurement to determine focus of the patterned beam used to form the target.

26. The method of any preceding clause, further comprising performing a calibration process and a monitor and control process.

27. The method of clause 26, comprising, during the calibration process, using the patterned beam to form the first target by exposing a calibration substrate using multiple combinations of focus and exposure offsets, wherein the illuminating and detecting is performed on the calibration substrate and comprises obtaining a plurality of the asymmetry measurements as a function of focus, and further comprising calculating a focus calibration curve from the plurality of the asymmetry measurements and corresponding focus offsets.

28. The method of clause 27, comprising, during the monitor and control process, using the patterned beam to form the first target by exposing a monitor substrate, wherein the illuminating and detecting is performed on the monitor substrate, and further comprising using the focus calibration curve to convert the asymmetry measurement to a focus measurement.

29. The method of clause 28, wherein the monitor substrate is exposed with a deliberate focus offset sufficient such that all of the focus measurements are on one side of a peak of the focus calibration curve and further comprising calculating actual focus measurements as a difference of the focus measurements obtained using the focus calibration curve and the deliberate focus offset.

30. The method of clause 28 or clause 29, wherein the focus measurements are used to optimize focus settings during subsequent lithographic processes.

31. The method of any preceding clause, wherein the asymmetry measurement comprises calculating the difference between detected positive and negative higher diffraction orders.

32. The method of any preceding clause, wherein the patterned beam has a wavelength within the region of 5 nm to 20 nm.

33. The method of any preceding clause, further comprising using a patterned beam to form the target as part of a lithographic process.

34. A patterning device comprising a first pattern for patterning a beam to form a first target comprising alternating first and second structures, wherein the patterning device comprises:

first structure features to form the first structures; and
second structure features to form the second structures,
wherein the second structure features are configured such that the form of the second structures is focus dependent such that its form depends upon the focus of the patterned beam when forming the first target and the first structure features are configured such that the form of the first structures does not have the same focus dependence as that of the second structures.

35. The patterning device of clause 34, wherein the first structure features are configured such that the form of the first structures have no deliberate dependence upon the focus of the patterned beam when forming the first target.

36. The patterning device of clause 34, wherein the first structure features are configured such that the form of the first structures are dependent upon the focus of the patterned beam when forming the first target, the focus dependence being different to that of the second structures.

37. The patterning device of clause 36, wherein the first structure features are configured such that the focus dependence differs for the first and second structures in such a way that a focus shift causes shifts in a center of gravity of the first structures and the second structures which are in opposite directions.

38. The patterning device of any of clauses 35 to 37, wherein:

the first structure features and the second structure features both comprise a low resolution substructure feature for forming low resolution substructures; and the second structure features and, where the form of the first structures is focus dependent, the first structure features comprise a high resolution substructure feature for forming high resolution substructures such that the number and/or size of high resolution substructures in the first target depends upon the focus of the patterned beam when forming the first target.

39. The patterning device of clause 38, wherein the high resolution substructure features comprise a plurality of elongate high resolution substructure features extending in a direction normal to that of the low resolution substructure features.

40. The patterning device of clause 38, wherein the high resolution substructure features comprise a plurality of elongate high resolution substructure features arranged parallel to the low resolution substructure features.

41. The patterning device of clause 38, wherein the high resolution substructure features comprise a two dimensional array of high resolution substructure features.

42. The patterning device of any of clauses 38 to 41, wherein the plurality of high resolution substructure features comprise high resolution substructure features having different linewidths.

43. The patterning device of clause 42, wherein the plurality of high resolution substructure features are arranged in order of decreasing linewidth from the low resolution substructure feature.

44. The patterning device of any of clauses 38 to 43, wherein the high resolution substructure features each have a linewidth less than 50 nm.

45. The patterning device of any of clauses 38 to 44, comprising product features and mask effect features, the mask effect features causing a three-dimensional mask effect such that the first target is formed with a best focus which is offset from a best focus for the product features.

46. The patterning device of clause 45, wherein the mask effect features comprise one or more of the high resolution substructures.

47. The patterning device of any of clauses 38 to 46, being operable to pattern a beam to form the first target according to a lithographic process.

48. The patterning device of any of clauses 38 to 47, comprising a product area, and peripheral to the product area, a scribe line area, wherein the first structure features and second structure features are located within the scribe lane area, the first structure features are located at a first side of the scribe lane area, and the second structure features are located on a side opposite the first side of the product area, such that the first structure features are located directly opposite, relative to a single axis, of the second structure features.

49. The patterning device of clause 48, wherein the patterning device comprises a second pattern for patterning a beam to form a second target, the second pattern comprising third and fourth structure features, the fourth structure features having at least one parameter different to the second structure features.

50. The patterning device of clause 49, wherein the placement of the third structure features relative to the fourth structure features in the second pattern is similar to the placement of the first structure features relative to the second structure features in the first pattern.

51. A substrate comprising a first target having alternating first and second structures wherein:

the first structure and the second structure both comprise a low resolution substructure; and at least the second structure comprises a high resolution substructure, the number and/or size of high resolution substructures in the first target having been determined by the focus of a patterned beam used to form the first target.

52. The substrate of clause 51, wherein the high resolution substructures comprise a plurality of elongate high resolution substructures extending in a direction normal to that of the low resolution substructures.

53. The substrate of clause 51, wherein the high resolution substructures comprise a plurality of elongate high resolution substructures arranged parallel to the low resolution substructures.

54. The substrate of clause 51, wherein the high resolution substructures comprise a two dimensional array of high resolution substructures.

55. The substrate of any of clauses 51 to 54, wherein the high resolution substructures comprise high resolution substructures having different linewidths.

56. The substrate of clause 55, wherein the high resolution substructures are arranged in order of decreasing linewidth from the low resolution substructure.

57. The substrate of any of clauses 41 to 56, wherein the high resolution substructures each have a linewidth less than 50 nm.

58. The substrate of any of clauses 51 to 57, wherein the first target is formed using the patterning device of any of clauses 34 to 50.

59. The substrate of any of clauses 41 to 58, comprising a monitor substrate to monitor the lithographic process.

60. The substrate of any of clauses 51 to 59, further comprising at least a second target, the second target comprising third and fourth structures, the fourth structures having at least one parameter different to the second structures.

61. The substrate of clause 60, wherein the placement of the third structures relative to the fourth structures in the second target is similar to the placement of the first structures relative to the second structures in the first target.

62. A lithographic apparatus being operable to perform the method of any of clauses 1 to 33.

63. A computer program comprising a sequence of machine-readable instructions describing the method of any of clauses 1 to 33.

64. A data storage medium having a computer program as defined in clause 63 stored therein.

Although the embodiments are described in relation to EUV lithography, embodiments herein are applicable to lithography processes using radiation at other (e.g., longer) wavelengths, for example at 193 nm.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

The invention claimed is:

1. A method of obtaining focus information relating to a lithographic process, the method comprising:
    illuminating a first target, the first target comprising alternating first and second structures, the form of the second structures being focus dependent such that its form depends upon the focus of a patterned beam used to form the first target and the form of the first structures not having the same focus dependence as that of the second structures, wherein a patterning device is used to produce the patterned beam, the patterning device comprising first structure features to form the first structures and second structure features to form the second structures, the second structure features comprise a low resolution substructure feature to form low resolution substructures; and the second structure features comprise a high resolution substructure feature to form high resolution substructures, the high resolution substructures comprising a plurality of elongate high resolution substructures arranged essentially parallel to the low resolution substructures; and
    detecting radiation scattered by the first target to obtain for that first target an asymmetry measurement representing an overall asymmetry of the first target, the asymmetry measurement being indicative of the focus of the patterned beam when forming the first target.

2. The method of claim 1, wherein the high resolution substructures comprise a two dimensional array of high resolution substructures.

3. The method of claim 1, wherein the high resolution substructures comprise high resolution substructures having different linewidths.

4. The method of claim 3, wherein the high resolution substructures are arranged in order of decreasing linewidth from the low resolution substructure.

5. The method of claim 1, wherein the form of the first structures has no deliberate dependence upon the focus of the patterned beam when forming the first target.

6. The method of claim 1, wherein the form of the first structures is dependent upon the focus of the patterned beam when forming the first target, the focus dependence being different to that of the second structures.

7. The method of claim 6, wherein the focus dependence differs for the first and second structures such that a focus shift causes shifts in a center of gravity of the first structures and the second structures which are in opposite directions.

8. The method of claim 1, wherein the first structure features also comprise a low resolution substructure feature to form low resolution substructures; and, where the form of the first structures is focus dependent, the first structure features also comprise a high resolution substructure feature to form high resolution substructures such that the number and/or size of high resolution substructures in the first target depends upon the focus of the patterned beam when forming the first target.

9. The method of claim 1, wherein a linewidth of the low resolution substructures is between 10 nm and 50 nm greater than a linewidth of the high resolution substructures.

10. The method of claim 1, wherein the patterning device comprises mask effect features which cause a three-dimensional mask effect such that the first target is formed with a best focus which is offset from a best focus for product features on the patterning device.

11. The method of claim 10, wherein the mask effect features comprise one or more of the high resolution substructures.

12. The method of claim 1, wherein the first target is configured such that the asymmetry measurement comprises a first asymmetry component resultant from a center of gravity shift between the first structures and the second structures, and a second asymmetry component resultant from asymmetry in the profile of the second structures, and wherein the first target is formed with a best focus which is offset from a best focus for product features on the patterning device, the best focus offset resulting from the second asymmetry component.

13. The method of claim 12, further comprising optimizing the best focus offset through variations of the second structure profile and relative placement of the first structures and the second structures.

14. The method of claim 1, further comprising illuminating at least a second target, the second target comprising third and fourth structures, the fourth structures having at least one parameter different to the second structures.

15. The method of claim 14, wherein the placement of the third structures relative to the fourth structures in the second target is similar to the placement of the first structures relative to the second structures in the first target.

16. The method of claim 14, further comprising:
detecting radiation scattered by the second target to obtain for the second target a second asymmetry measurement;
determining the difference of the second asymmetry measurement and the asymmetry measurement from the first target; and
using the difference to determine the sign of a focus determination.

17. The method of claim 14, further comprising:
constructing a multi-variate focus model of the first and second targets; and
using the model to determine the sign and/or value of a focus determination.

18. The method of claim 1, further comprising forming the first target in at least two exposures, the forming comprising:
performing a first exposure onto a substrate, wherein the first exposure comprises forming the first structures or the second structures; and
performing a second exposure onto the substrate, adjacent to the first exposure and such that there is a region of overlap of the first exposure and second exposure on the substrate, the region of overlap comprising the formed first structures or formed second structures,
wherein the second exposure comprises forming in the region of overlap on the substrate, the other of the first structures or the second structures, thereby forming the first target.

19. The method of claim 18, wherein the first and second structures comprise trenches in photoresist.

20. The method of claim 18, wherein the patterning device comprises a product area, and peripheral to the product area, a scribe line area, and the first structure features and the second structure features are located in the scribe lane area.

21. A non-transitory data storage medium having machine-readable instructions that when executed are configured to cause a computer system to cause performance of the method of claim 1.

22. The method of claim 1, wherein the high resolution substructure feature is configured such that the form of the high resolution substructures is focus dependent such that its form depends upon the focus of the patterned beam when forming the first target, wherein the first structure features are configured such that the form of the first structures does not have the same focus dependence as that of the high resolution substructures, and wherein the low resolution substructure feature is configured such the low resolution substructures are realized in the first target in all the same focus conditions when the first structures are realized in the first target.

23. A patterning device comprising a pattern for patterning a beam to form a target comprising alternating first and second structures, wherein the patterning device comprises:
first structure features to form the first structures; and
second structure features to form the second structures, the second structure features comprising a low resolution substructure feature to form low resolution substructures and a high resolution substructure feature to form high resolution substructures, the high resolution substructures comprising a plurality of elongate high resolution substructures arranged essentially parallel to the low resolution substructures,
wherein the high resolution substructure feature is configured such that the form of the high resolution substructures is focus dependent such that its form depends upon the focus of the patterned beam when forming the target, wherein the first structure features are configured such that the form of the first structures does not have the same focus dependence as that of the high resolution substructures, and wherein the low resolution substructure feature is configured such the low resolution substructures are realized in the target in all the same focus conditions when the first structures are realized in the target.

24. A substrate comprising a target having alternating first and second structures wherein:
the first structure and the second structure both comprise a low resolution substructure, wherein the low resolution substructure of the first structure is formed in the target in all the same focus conditions when the low resolution substructure of the second structure is realized in the target; and
at least the second structure comprises a high resolution substructure, the high resolution substructure comprising one or more high resolution substructures arranged essentially parallel to the low resolution substructure, the number and/or size of high resolution substructures in the target having been determined by the focus of a patterned beam used to form the target.

\* \* \* \* \*